US011422008B2

(12) United States Patent
Kobayashi

(10) Patent No.: US 11,422,008 B2
(45) Date of Patent: Aug. 23, 2022

(54) ROTATION ANGLE DETECTION APPARATUS AND ROTATION ANGLE DETECTION METHOD, AND SUBSTRATE PROCESSING APPARATUS AND SUBSTRATE PROCESSING METHOD USING SAME

(71) Applicant: TOKYO ELECTRON LIMITED, Tokyo (JP)

(72) Inventor: Takeshi Kobayashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 23 days.

(21) Appl. No.: 16/596,001

(22) Filed: Oct. 8, 2019

(65) Prior Publication Data
US 2020/0116528 A1 Apr. 16, 2020

(30) Foreign Application Priority Data

Oct. 11, 2018 (JP) .............................. JP2018-192775

(51) Int. Cl.
*G01D 5/20* (2006.01)
*C23C 16/458* (2006.01)
*B05C 13/00* (2006.01)
*G01D 5/34* (2006.01)

(52) U.S. Cl.
CPC .............. *G01D 5/20* (2013.01); *B05C 13/00* (2013.01); *C23C 16/4588* (2013.01); *G01D 5/34* (2013.01)

(58) Field of Classification Search
None
See application file for complete search history.

(56) References Cited

U.S. PATENT DOCUMENTS

| 10,072,336 B2* | 9/2018 | Kato | C23C 16/52 |
| 2001/0004849 A1* | 6/2001 | Jin | G01D 5/2451 73/862.331 |
| 2003/0088989 A1* | 5/2003 | Nishikawa | G01D 5/245 33/1 PT |
| 2003/0177649 A1* | 9/2003 | Ito | G01D 5/363 33/1 PT |
| 2004/0056748 A1* | 3/2004 | Masaki | G01L 5/221 336/119 |

(Continued)

FOREIGN PATENT DOCUMENTS

| JP | 64-33021 U | 3/1989 |
| JP | 1237413 A | 9/1989 |

(Continued)

*Primary Examiner* — Sylvia MacArthur
(74) *Attorney, Agent, or Firm* — Nath, Goldberg & Meyer; Jerald L. Meyer; Tanya E. Harkins

(57) ABSTRACT

A rotation angle detection apparatus includes a movable pattern prepared on an outer peripheral side surface of a rotary shaft and having a shape that changes along a circumferential direction of the outer peripheral side surface; and a stationary pattern fixedly arranged around the rotary shaft so as to face the movable pattern. An overlapping state between the movable pattern and the stationary pattern changes by rotation of the rotary shaft. A physical quantity changing according to a change in the overlapping state between the movable pattern and the stationary pattern is detected, and a rotation angle of the rotary shaft is detected based on the physical quantity.

12 Claims, 12 Drawing Sheets

(56) References Cited

U.S. PATENT DOCUMENTS

| | | | |
|---|---|---|---|
| 2015/0330811 A1* | 11/2015 | Tsuchiya | A63H 27/02 318/653 |
| 2017/0160101 A1* | 6/2017 | Frese | G01D 5/20 |
| 2017/0218514 A1* | 8/2017 | Kato | H01J 37/32779 |
| 2018/0195173 A1* | 7/2018 | Kato | C23C 16/45551 |
| 2018/0251892 A1* | 9/2018 | Kobayashi | H01L 21/68764 |
| 2019/0177841 A1* | 6/2019 | Tomizawa | C23C 16/463 |
| 2019/0186004 A1* | 6/2019 | Kato | C23C 16/45551 |
| 2020/0370176 A1* | 11/2020 | Kobayashi | C23C 16/45551 |

FOREIGN PATENT DOCUMENTS

| | | |
|---|---|---|
| JP | 5-312505 A | 11/1993 |
| JP | 11-194004 A | 7/1999 |
| JP | 2017-187490 A | 10/2017 |
| JP | 2018-113431 A | 7/2018 |

\* cited by examiner

ROTATION ANGLE DETECTION APPARATUS AND ROTATION ANGLE DETECTION METHOD, AND SUBSTRATE PROCESSING APPARATUS AND SUBSTRATE PROCESSING METHOD USING SAME

CROSS-REFERENCE TO RELATED APPLICATION

This application is based upon and claims the benefit of priority from Japanese Patent Application No. 2018-192775, filed on Oct. 11, 2018, the entire contents of which are incorporated herein by reference.

TECHNICAL FIELD

The present disclosure relates to a rotation angle detection apparatus and a rotation angle detection method, and a substrate processing apparatus and a substrate processing method using the same.

BACKGROUND

A position detection method for detecting a change in the degree of electromagnetic coupling caused by relative displacement of a scale and a slider in which tooth-like patterns are arranged by a phase system is known (for example, see Patent Document 1).

PRIOR ART DOCUMENT

Patent Document: Japanese Application Publication No. H01-237413

SUMMARY

According to one embodiment of the present disclosure, there is provided a rotation angle detection apparatus which includes a movable pattern prepared on an outer peripheral side surface of a rotary shaft and having a shape that changes along a circumferential direction of the outer peripheral side surface; and a stationary pattern fixedly arranged around the rotary shaft so as to face the movable pattern. An overlapping state between the movable pattern and the stationary pattern changes by rotation of the rotary shaft. A physical quantity changing according to a change in the overlapping state between the movable pattern and the stationary pattern is detected, and a rotation angle of the rotary shaft is detected based on the physical quantity.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Modes for carrying out the present disclosure will now be described with reference to the drawings.

A rotation angle detection apparatus and a substrate processing apparatus according to the present disclosure detect a rotation amount (rotation angle) of a mounting table in an apparatus which processes a substrate by rotating the substrate mounting table installed on one surface side of a rotary table while revolving it, and supplying a processing gas to a region through which the mounting table passes, in a process container. The rotation amount (rotation angle) of the mounting table is detected by detecting an electromagnetic induction voltage generated in a movable pattern by means of allowing an AC current to flow through a stationary pattern to generate a magnetic field using the conductive movable pattern prepared on an outer peripheral side surface of a rotary shaft of the mounting table and the conductive stationary pattern prepared around the rotary shaft to face the movable pattern. Hereinafter, a configuration in which the rotation angle of the mounting table is detected will be specifically described.

Figure 1:
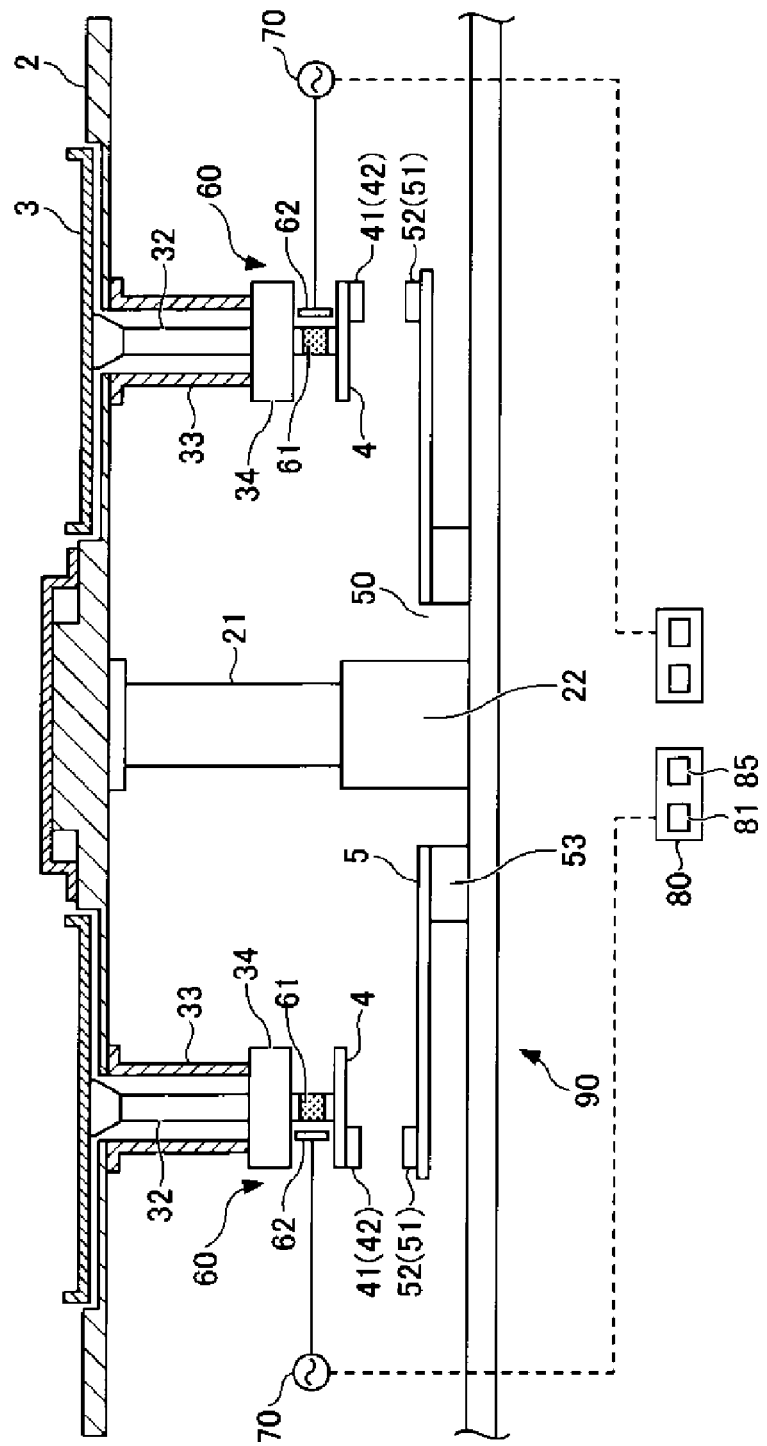
FIG. 1 is a longitudinal sectional view illustrating an embodiment of the present disclosure of a rotary table having a jig for detecting a rotation.
Figure 2:
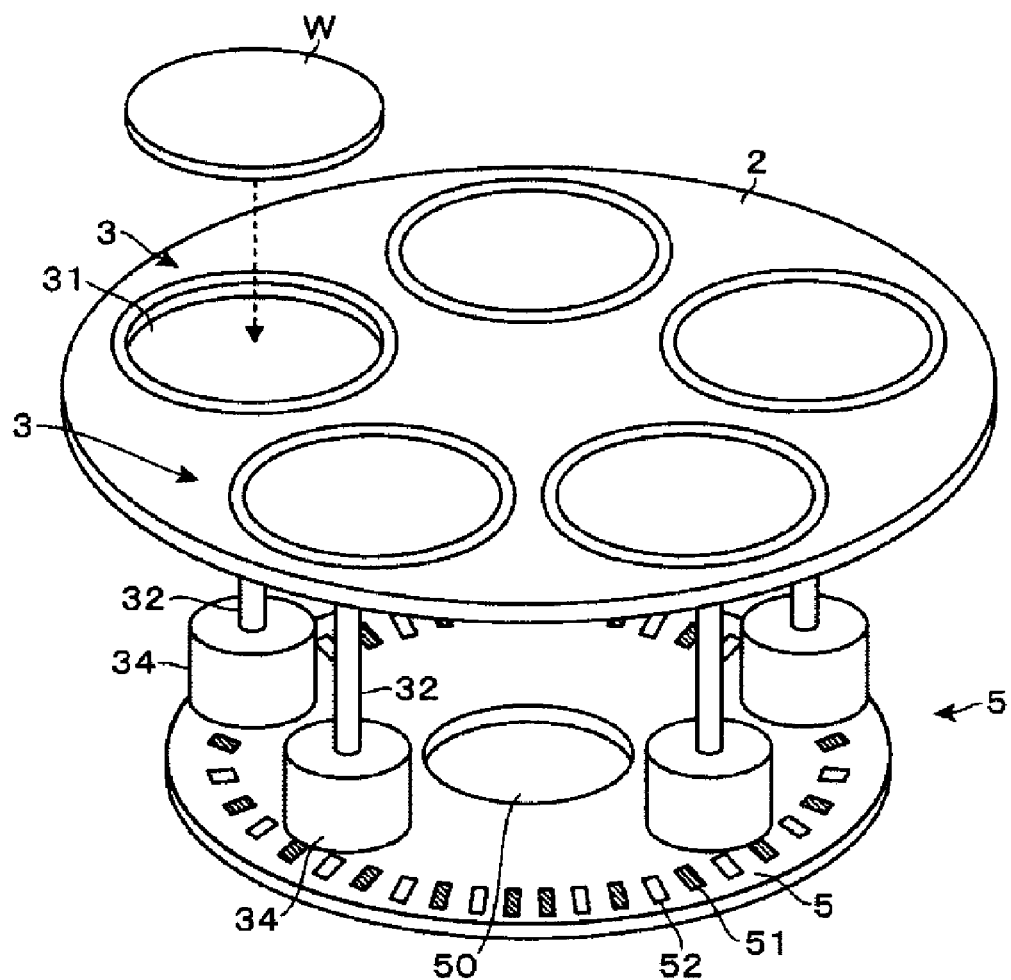
FIG. 2 is a schematic perspective view illustrating the rotary table.

First, an embodiment of the rotation angle detection apparatus used to detect the rotation amount of the mounting table will be described. FIG. 1 is a longitudinal sectional view illustrating a state in which a rotation angle detection apparatus 90 is installed on a rotary table in a substrate processing apparatus. A structure of a rotary table 2 will be described with reference to FIGS. 1 to 4. FIG. 2 schematically illustrates a main part of the rotary table 2 in which the rotation angle detection apparatus is omitted. A rotary shaft 21 extending vertically downward is connected to a central portion of the rotary table 2, in which the rotary shaft 21 is connected to a rotary mechanism 22 for revolution. The rotary table 2 rotates, for example, clockwise, as viewed from the upper surface, by rotating the rotary shaft 21 using the rotary mechanism 22 for revolution.

A mounting table 3 which revolves by the rotation of the rotary table 2 is installed on the upper surface side (one surface side) of the rotary table 2. The mounting table 3 has a circular planar shape, and for example, five mounting tables, are installed along the rotation direction of the rotary table 2. Recesses 31 are formed in the upper surfaces of the mounting tables 3, and wafers W as substrates are horizontally stored in the recesses 31. That is, the recesses 31 form substrate mounting parts on which the substrates are mounted. Also, for example, six mounting tables 3 may be installed on the rotary table 2.

A rotary shaft 32 for supporting each mounting table 3 is installed at a central portion on the lower surface side of each mounting table 3 so as to extend and protrude vertically downward. The rotary shaft 32 is supported by, for example, a bearing unit 34 fixed to the lower surface of the rotary table 2 via a cylindrical body 33. Therefore, the rotary shaft 32 is installed rotatably along with the rotary table 2, and the mounting table 3 is configured to revolve by the rotation of the rotary table 2. The bearing unit 34 includes a bearing for rotatably holding the rotary shaft 32, and a magnetic seal for preventing scattering of particles from the bearing (none of which are shown). The lower portion of the rotary shaft 32 penetrates the bearing unit 34, and a driven gear 4 is installed at a lower end portion of the rotary shaft 32.

Figure 3:
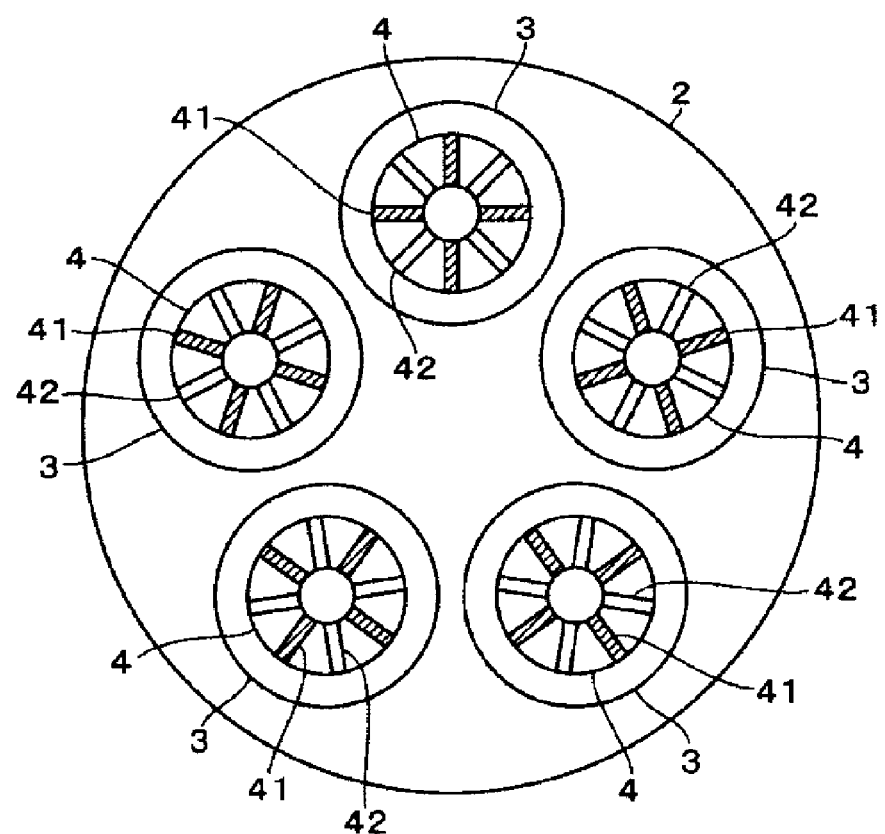
FIG. 3 is a bottom view schematically illustrating a driven gear installed on a lower surface of a mounting table.

FIG. 3 schematically illustrates the driven gear 4 as viewed from the lower surface side. The driven gear 4 is formed in a disc shape, and is connected to the rotary shaft 32 in a state in which the central axes of the driven gear 4 and the rotary shaft 32 coincide with each other. Accordingly, the driven gear 4 is connected to the mounting table 3 via the rotary shaft 32, and revolves by the rotation of the rotary table 2. The bearing unit 34 rotatably holds the rotary shaft 32. Therefore, when the driven gear 4 is rotated about its axes, each mounting table 3 rotates by the rotary shaft.

N pole parts 41 and S pole parts 42, which are magnetic pole parts formed of permanent magnets, are alternately arranged along the rotation direction on the lower surface of the driven gear 4. The N pole parts 41 are hatched to distinguish them from the S pole parts 42. In this example, the N pole parts 41 and the S pole parts 42 exposed to the lower surface of the driven gear 4 are each formed in the same rectangular shape, and for example, 18 pole parts are arranged at intervals in the circumferential direction so as to radially extend laterally from the central portion of the lower surface of the driven gear 4. The lengths of the N pole parts 41 and the S pole parts 42 are set, for example, shorter than the radius of the driven gear 4 so as not to exceed the center of the bottom surface of the driven gear 4.

As illustrated in FIGS. 1 and 2, a driving gear 5 is disposed below the driven gear 4. This driving gear 5 constitutes a magnetic gear mechanism with the driven gear 4 and is installed to face the revolution orbit of the driven gear 4 along the entire circumference of the revolution orbit. The driving gear 5 of this example is formed of an annular plate having a circular opening 50 at the central portion thereof, and the center of the opening 50 of the driving gear 5 is arranged to be aligned with the rotation center of the rotary table 2. N pole parts 51 and S pole parts 52, which are magnetic pole parts formed of permanent magnets, are alternately arranged over the entire circumference along the revolution orbit of the driven gear 4 on the upper surface of the driving gear 5.

Figure 4:
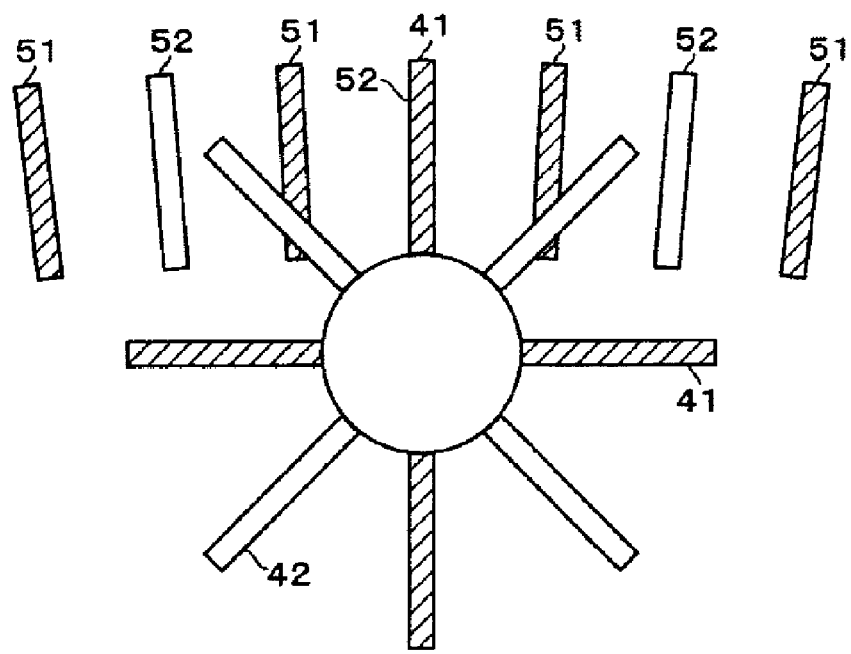
FIG. 4 is a plan view illustrating part of the driven gear and a driving gear.

The N pole parts 51 and the S pole parts 52 which are the magnetic pole parts of the driving gear 5 are arranged on a surface facing the lower surface of the driven gear 4. FIG. 4 illustrates the magnetic pole parts (the N pole parts 41 and S pole parts 42) of one driven gear 4 and the magnetic pole parts (the N pole parts 51 and S pole parts 52) of the driving gear 5 on the lower side of the driven gear 4, such that both the magnetic pole parts correspond to each other. In this manner, for example, the N pole parts 51 and the S pole parts 52 exposed on the surface of the annular driving gear 5 are formed in, for example, a rectangular shape, so as to overlap with the shapes of the N pole parts 41 and the S pole parts 42 formed on the lower surface of the driven gear 4 facing the surface of the driving gear 5. FIG. 4 illustrates a state in which the N pole parts 41 of the driven gear 4 and the S pole parts 52 of the driving gear 5 overlap each other. In an actual example of the driving gear 5, there are arranged around 300 N pole parts 51 and S pole parts 52 in total.

A rotary mechanism 53 for rotation formed of, for example, an annular direct drive motor (DD motor), for rotating the driving gear 5 is installed on the lower surface of the driving gear 5. The driving gear 5 is configured to rotate around the center of the opening 50 as the rotation center by rotating the rotary mechanism 53 for rotation. Therefore, the driving gear 5 and the rotary table 2 rotate around the same rotary shaft. In this example, the rotary shaft 21 of the rotary table 2 is connected to the rotary mechanism 22 for revolution installed in the opening 50 of the driving gear 5. However, the present disclosure is not limited to the aforementioned configuration as long as the rotary table 2 and the driving gear 5 are configured to rotate with the rotation centers thereof aligned with each other.

Next, the revolution and rotation of the mounting table 3 will be described. The driven gear 4 stops at a position determined by a combined action of an attractive force and a repulsive force between the respective magnetic pole parts (the N pole parts 41 and S pole parts 42) of the driven gear 4 and the respective magnetic pole parts (the N pole parts 51 and S pole parts 52) of the driving gear 5. Therefore, when the rotary table 2 and the driving gear 5 are rotated at the same revolutions per minute (rotation speed: rpm), the driven gear 4, i.e., the mounting table 3 does not rotate because the driven gear 4 is stopped relative to the driving gear 5.

The mounting table 3 rotates when there is a difference between the rpms of the driving gear 5 and the rotary table 2, i.e., when a velocity difference occurs between the angular velocity of the driving gear 5 and the angular velocity (so-called revolution angular velocity) of the driven gear 4 by the rotation of the rotary table 2. When the angular velocity of the driving gear 5 is larger than the angular velocity of the driven gear 4 (when a velocity difference obtained by subtracting the angular velocity of the driven gear 4 from the angular velocity of the driving gear 5 is positive), the arrangement of the N pole parts 51 and the S pole parts 52 of the driving gear 5 moves from the left side to the right side with reference to FIG. 4 below the arrangement of the N pole parts 41 and the S pole parts 42 of the driven gear 4 facing the driving gear 5. Therefore, the repulsive force and the attractive force from the driving gear 5 acting on the driven gear 4 move to the right side and the arrangement of the N pole parts 41 and the S pole parts 42 of the driven gear 4 is also pulled to the right side accordingly. As a result, the driven gear 4 is rotated clockwise.

Furthermore, when the angular velocity of the driving gear 5 is smaller than the angular velocity of the driven gear 4 (when a velocity difference obtained by subtracting the angular velocity of the driven gear 4 from the angular velocity of the driving gear 5 is negative), the arrangement of the N pole parts 51 and the S pole parts 52 of the driving gear 5 moves from the right side to the left side with reference to FIG. 4 below the arrangement of the N pole parts 41 and the S pole parts 42 of the driven gear 4 facing the driving gear 5. Therefore, the repulsive force and the attractive force from the driving gear 5 acting on the driven gear 4 move to the left side and the arrangement of the N pole parts 41 and the S pole parts 42 of the driven gear 4 is also pulled to the left side accordingly. As a result, the driven gear 4 is rotated counterclockwise.

Figure 5:
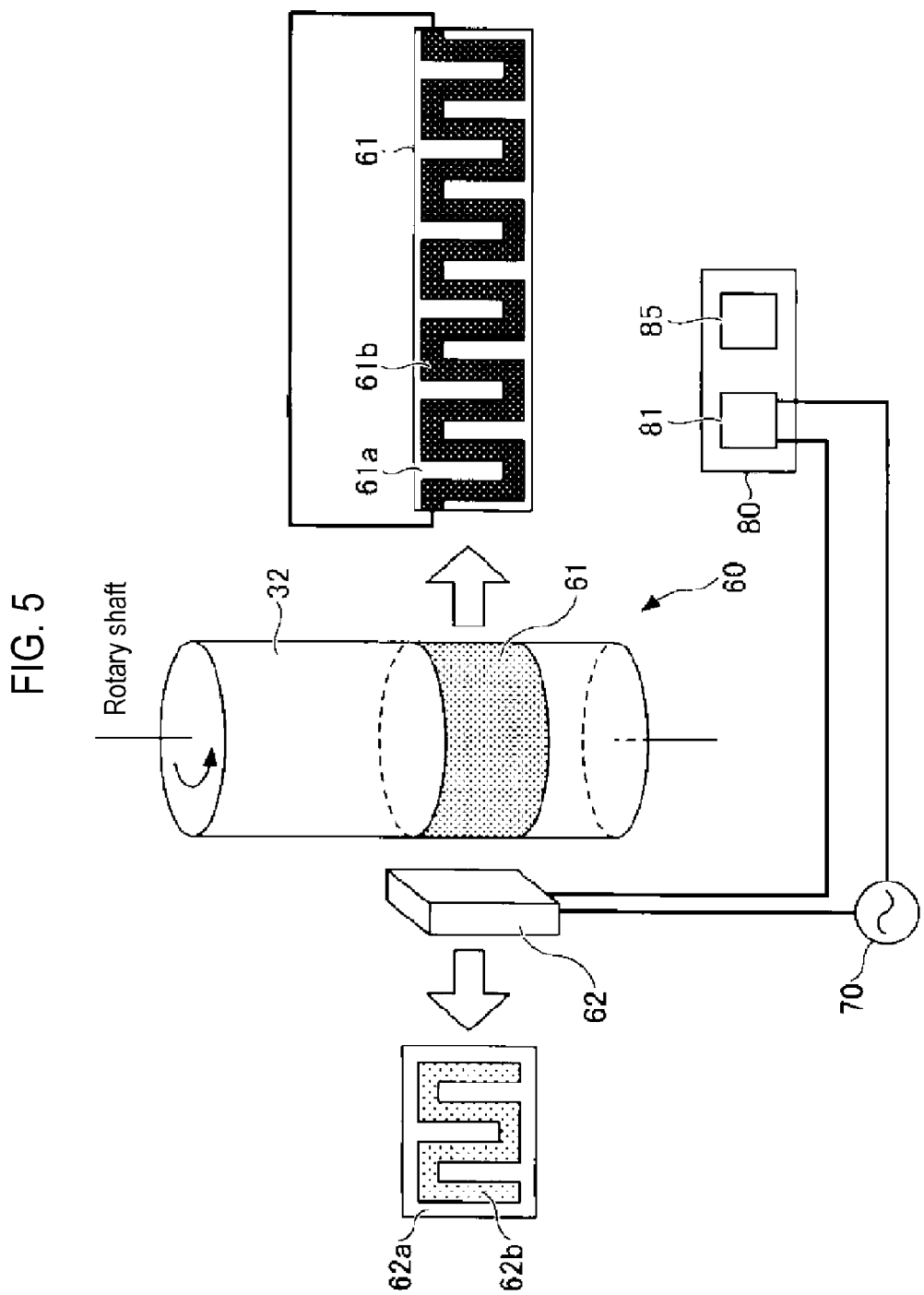
FIG. 5 is a diagram illustrating a rotation angle detection apparatus according to a first embodiment of the present disclosure.

Next, the rotation angle detection apparatus for detecting the rotation angle of the rotary shaft 32 of the mounting table 3 will be described. FIG. 5 is a diagram illustrating a rotation angle detection apparatus 90 according to a first embodiment of the present disclosure. The rotation angle detection apparatus 90 according to the first embodiment includes a pattern part 60, an AC power source 70, and a detection part 80. Furthermore, the pattern part 60 includes a movable pattern 61 and a stationary pattern 62. In addition, the detection part 80 includes an induced voltage detection part 81 and an angle detection part 85.

The movable pattern 61 and the stationary pattern 62 of the pattern part 60 generate an electromagnetic induction voltage. The movable pattern 61 is a pattern prepared on an outer peripheral side surface of the rotary shaft 32, and rotates along with the rotation of the rotary shaft 32. On the other hand, the stationary pattern 62 is spaced apart around the outer peripheral side surface of the rotary shaft 32 and is prepared to face the movable pattern 61.

The movable pattern 61 is configured by, for example, forming a conductive pattern 61*b* on an insulating film 61*a*. On the other hand, the stationary pattern 62 is prepared by forming a conductive pattern 62*b* on a surface of an insulating film or a thicker insulating member 62*a*. The movable pattern 61 may also be configured by adhering the insulating film 61*a* to the outer peripheral side surface of the rotary shaft 32. Thus, the conductive pattern 61*b* can be prepared on the surface of the rotary shaft 32 more easily than directly forming the pattern on the rotary shaft 32.

The conductive patterns 61*b* and 62*b* are formed in, for example, a pattern having a periodic shape such as a tooth shape, a wave shape, a zigzag shape or the like. When the stationary pattern 62 in which such periodic conductive pattern 62*b* is formed is fixed at one place, and the rotary shaft 32 on which the conductive pattern 61*b* is formed is rotated, the conductive patterns 61*b* and 62*b* move relative to each other, and the overlapping state of the conductive patterns 61*b* and 62*b*, i.e., the overlapping portion and the overlapping area, change.

When AC power is supplied to the conductive pattern 62*b* of the stationary pattern 62, a periodically changing magnetic field is generated around the conductive pattern 62*b*. Then, when the conductive pattern 61*b* of the movable pattern 61 moves in such a magnetic field, an electromagnetic induction voltage that varies with time is generated in the conductive pattern 61*b* and the conductive pattern 62*b* according to a change in the degree of mutual coupling.

When it is configured such that the voltage detection part 81 in the detection part 80 measures and detects the electromagnetic induction voltage thus generated, and that the rotation angle detection part 85 calculates the rotation angle of the rotary shaft 32 from the waveform of the electromagnetic induction voltage, the rotation angle of the rotary shaft 32 can be detected. That is, when a positional relationship between the conductive patterns 61*b* and 62*b* and a relationship between waveforms of the electromagnetic induction voltage are known in advance, the rotation angle detection part 85 can detect at which position the rotary shaft 32 is from the electromagnetic induction voltage waveform detected by the voltage detection part 81.

Figure 6:
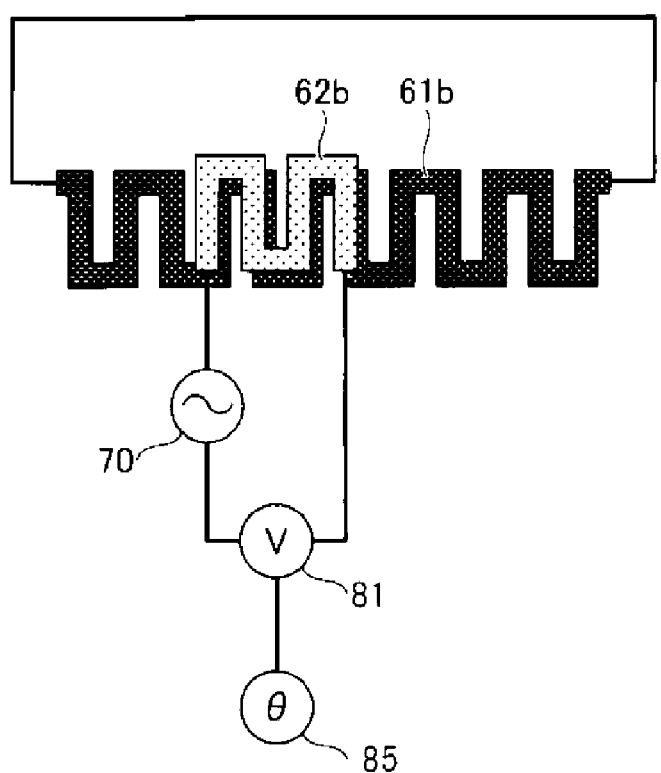
FIG. 6 is a diagram schematically illustrating detection of an electromagnetic induction voltage of the rotation angle detection apparatus according to the first embodiment.

FIG. 6 is a diagram schematically illustrating detection of the electromagnetic induction voltage by the rotation angle detection apparatus according to the first embodiment. An AC current is supplied from the AC power source 70 to the conductive pattern 62*b* of the stationary pattern 62 so that the conductive pattern 61*b* of the movable pattern 61 moves in the magnetic field to generate an electromagnetic induction voltage. It is illustrated that the voltage detection part 81 measures the electromagnetic induction voltage, and that the angle detection part 85 detects the rotation angle of the rotary shaft 32 from the voltage waveform measured by the voltage detection part 81.

Figure 7:
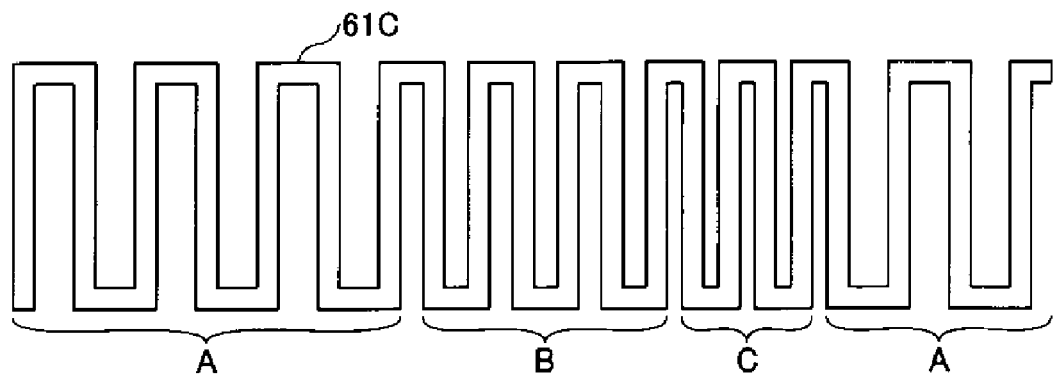
FIG. 7 is a diagram illustrating an example of a conductive pattern different from that in FIG. 6.

FIG. 7 is a diagram illustrating an example of a conductive pattern 61*c* different from that in FIG. 6. As illustrated in FIG. 7, patterns having different pitches of tooth-like patterns may be combined. In FIG. 7, A with the largest pitch, B with the second largest pitch, and C with the smallest pitch are combined. In this manner, it is possible to make the change of the electromagnetic induction voltage different and to accurately detect the rotation angle of the rotary shaft 32 by using the conductive pattern 61*c* having different pitches at certain positions.

Figure 8:
FIG. 8 is a diagram illustrating an example of a conductive pattern different from those in FIGS. 6 and 7.

FIG. 8 is a diagram illustrating an example of a conductive pattern 61*d* different from those in FIGS. 6 and 7. As illustrated in FIG. 8, the periodic conductive pattern 61*d*, such as a waveform or a zigzag shape, may be used.

Figure 9:
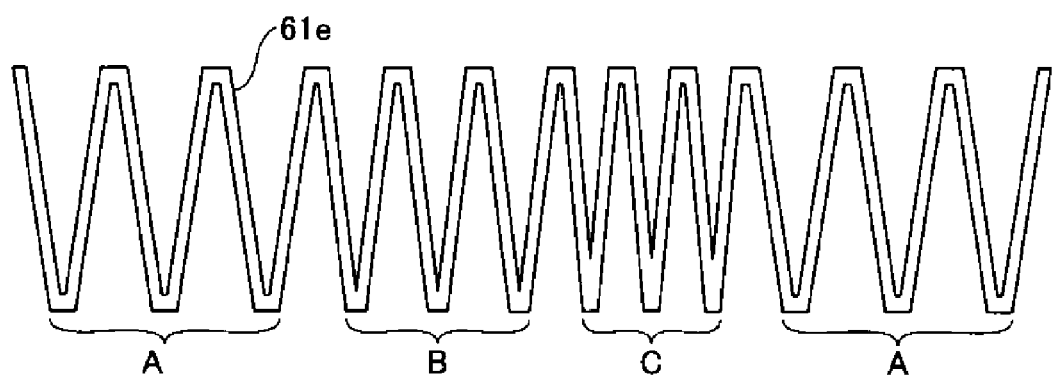
FIG. 9 is a diagram illustrating an example of a conductive pattern of a waveform having partially different pitches.

FIG. 9 is a diagram illustrating an example of a conductive pattern 61*e* of a waveform or a zigzag shape having partially different pitches. In this manner, even in the waveform pattern, A with the largest pitch, B with the second largest pitch, and C with the smallest pitch may be combined. It is possible to make the change of the electromagnetic induction voltage different and to accurately detect the rotation angle of the rotary shaft 32 by using the conductive pattern 61*c* having different pitches at certain positions.

Furthermore, it is not necessary to select a periodic pattern, and if the relationship between the waveforms of the electromagnetic induction voltage to be detected and the angle of the rotary shaft 32 is known in advance, an irregular conductive pattern may be used.

As described above, the conductive patterns 61*b* to 61*e* of the movable pattern 61 may be conductive patterns of various shapes depending on the application.

In addition, the stationary pattern 62 may be formed as the conductive pattern 61*b* of various shapes as needed, as well as the movable pattern 61. As described above, the conductive patterns 61*b* to 61*e* and 62*b* of the movable pattern 61 and the stationary pattern 62 may be patterns of various shapes according to applications.

Figure 10:
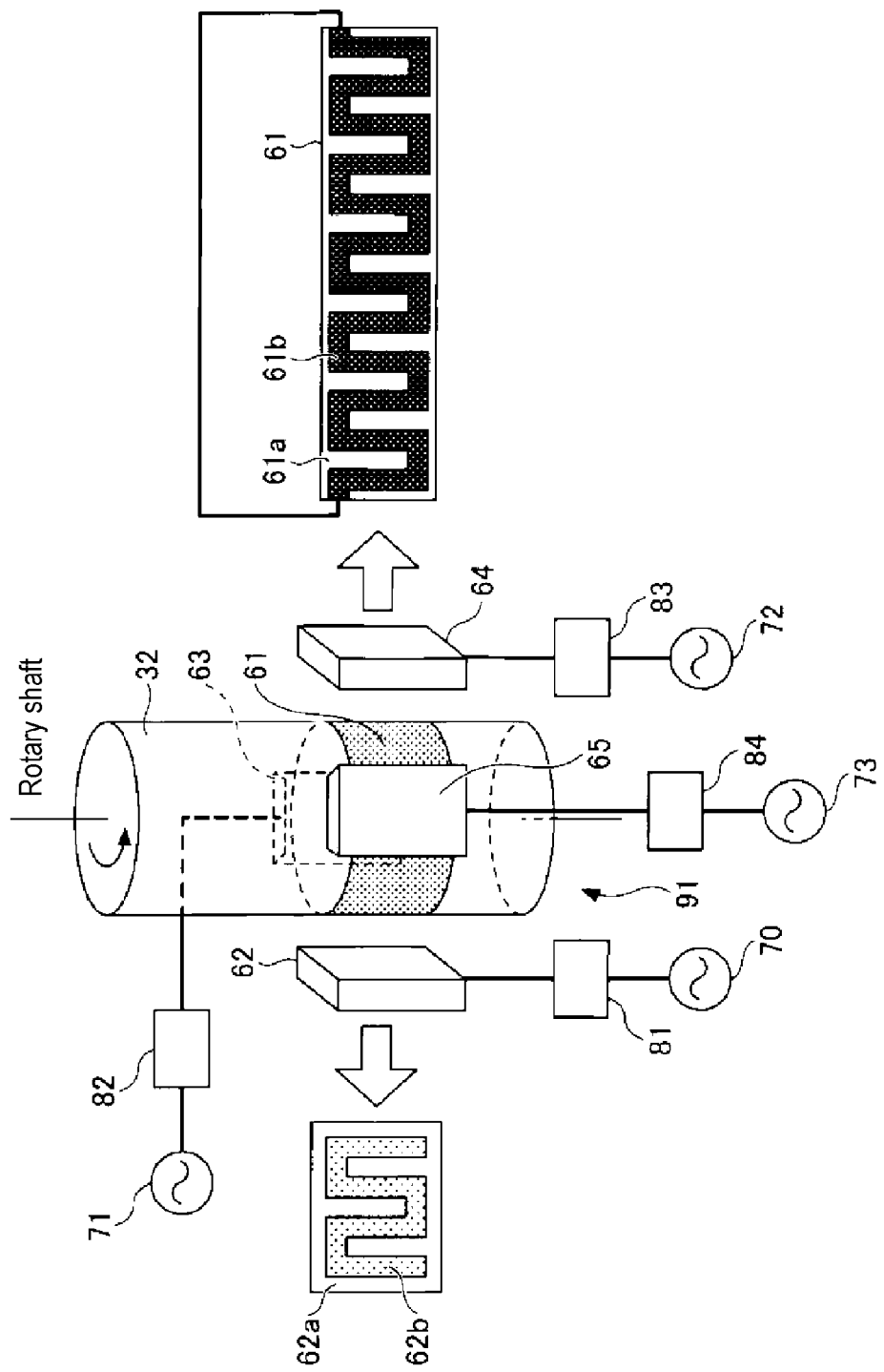
FIG. 10 is a diagram illustrating a configuration of a rotation angle detection apparatus according to a second embodiment of the present disclosure.

FIG. 10 is a diagram illustrating a configuration of a rotation angle detection apparatus 91 according to a second embodiment of the present disclosure. In the rotation angle detection apparatus 91 according to the second embodiment, four stationary patterns 62 to 65 are arranged around the rotary shaft 32. The four stationary patterns 62 to 65 are arranged so as to surround the outer peripheral side surface of the rotary shaft 32 at equal intervals.

Furthermore, four detection parts 81 to 84 are respectively connected between the conductive patterns of the stationary patterns 62 to 65 and the AC power sources 70 to 73 installed to correspond to the respective patterns. Thus, it is possible to prepare four voltage detection points corresponding to the four stationary patterns 62 to 65, and to enhance the accuracy of rotation angle detection. That is, it is possible to acquire voltage data at four places for one rotation of the rotary shaft 32 and to enhance the accuracy. The conductive patterns 61b distributed at the four places may be the same conductive pattern, or may be different conductive patterns. By knowing the method (voltage waveform) of the change of the electromagnetic induction voltage in advance, it is possible to detect the rotation angle of the rotary shaft 32 with high accuracy.

Furthermore, the number of stationary patterns 62 to 65 is not limited to four but may be any number of two or more which can be installed. Moreover, in FIG. 10, although they are arranged to become point-symmetrical with respect to the center of the rotary shaft 32, it is not limited to the symmetrical arrangement but may be set as various arrangements according to applications. However, from the viewpoint of enhancing the apparatus configuration and detection accuracy, it is preferable to arrange a plurality of stationary patterns 62 to 65 in point symmetry.

In addition, as the conductive pattern 61b of the movable pattern 61, as described with reference to FIGS. 7 to 9 in the first embodiment, a pattern having partially different pitches may be prepared, or various patterns may be used according to applications. Thus, it is possible to further enhance the accuracy of the rotation angle detection.

As described above, according to the rotation angle detection apparatus 91 of the second embodiment, it is possible to detect the rotation angle of the rotary shaft 32 with high accuracy by obtaining a plurality of voltage data using the plurality of detection parts 81 to 84 corresponding to the number of stationary patterns 62 to 65.

Figure 11:
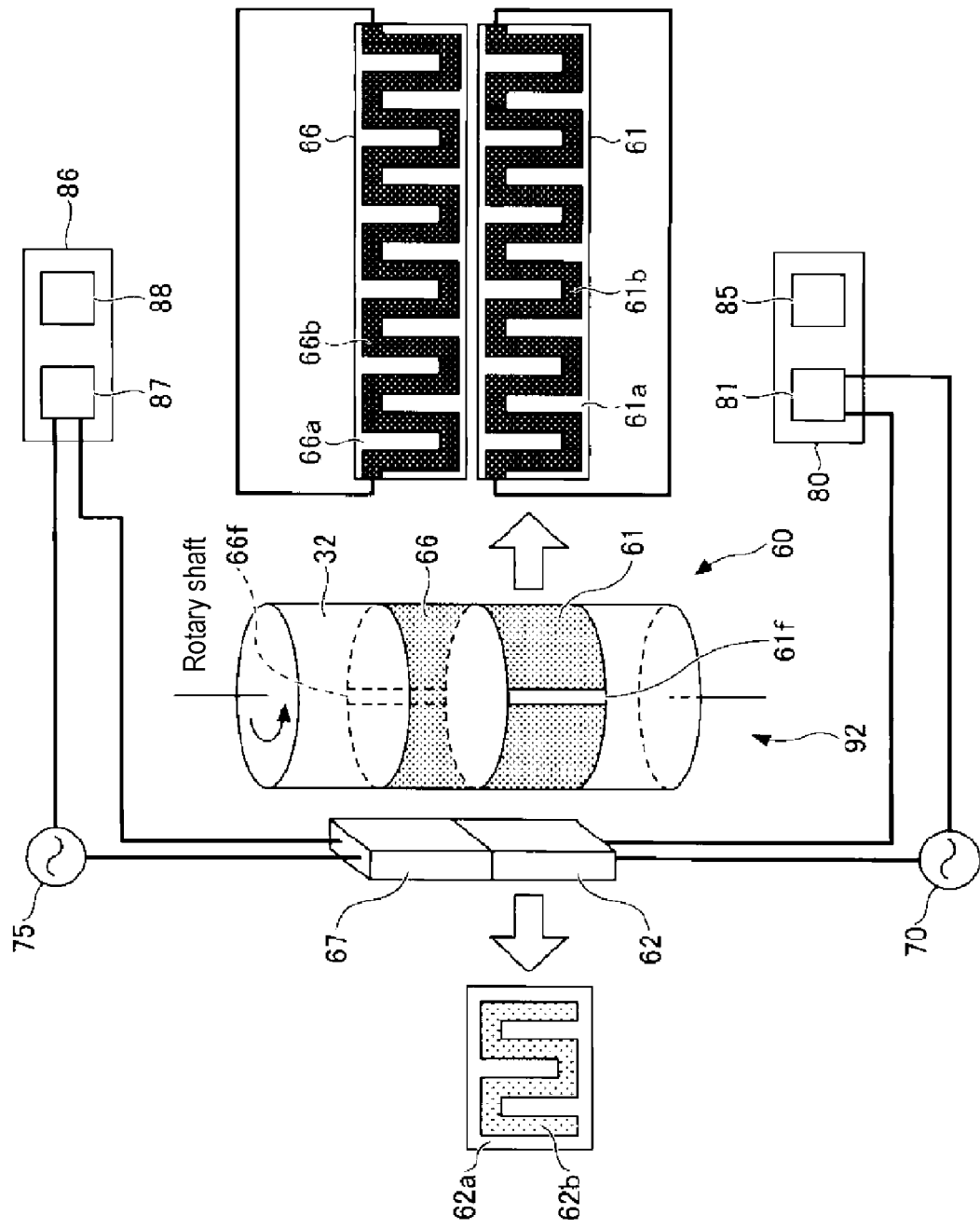
FIG. 11 is a diagram illustrating an example of a rotation angle detection apparatus according to a third embodiment of the present disclosure.

FIG. 11 is a diagram illustrating an example of a rotation angle detection apparatus 92 according to a third embodiment of the present disclosure. As illustrated in FIG. 11, the rotation angle detection apparatus 92 according to the third embodiment includes two stages of movable patterns 61 and 66, and two stages of stationary pattern parts 62 and 67 covering the height of two stages of the movable pattern. That is, the rotation angle detection apparatus 92 has a configuration in which the stationary pattern portion 67 is added to the upper stage of the stationary pattern 62 described with reference to FIG. 5. Furthermore, an AC power source 75 and a detection part 86 are connected to the stationary pattern part 67 of the upper stage. The detection part 86 includes a voltage detection part 87 and an angle detection part 88. That is, it is configured that the stationary side detection mechanism is installed in two stages.

When conductive patterns 61b and 66b of the movable patterns 61 and 66 are formed on the surfaces of resin films 61a and 66a, it is not easy to adhere the resin films 61a and 66a to the outer peripheral side surface of the rotary shaft 32 without a gap so that the conductive patterns 61b and 66b at both ends are continuous, and thus there may be a gap 61f between the both ends. When such a gap 61f is generated, a portion without the conductive patterns 61b and 66b may be generated, lowering the detection accuracy.

Therefore, the rotation angle detection apparatus 92 according to the third embodiment has a configuration in which another movable pattern 66 is prepared at a position higher than the portion where the gap 61f is generated, and the conductive pattern 66b compensates for a portion where the continuity of the conductive pattern 61b is interrupted. Since the conductive pattern 61b compensates for the gap 66f in which the continuity of the conductive pattern 66b is interrupted, the conductive patterns 61b and 66b complement each other, thereby eliminating a portion where no conductive pattern exists.

As described above, the stationary pattern 67 can extend in length to correspond to the movable patterns 61 and 66 installed in the axial direction of the rotary shaft 32 so as to cover both patterns of the movable patterns 61 and 66. After knowing the relationship between the voltage waveforms of interrupted portions of the conductive patterns 61b and 66b and the rotation angle, by knowing the voltage change in advance, it is possible to detect the rotation angle without interrupting the signal. In addition, it is easy to form the movable patterns 61 and 66 on the rotary shaft 32, and it is possible to reduce the assembling labor and to improve the workability.

Furthermore, the movable patterns 61 and 66 and the stationary pattern 62 and 67 may be combined with the rotation angle detection apparatuses 90 and 91 according to the first and second embodiments, and various conductive patterns or the plurality of stationary patterns 62 and 65 may also be included.

As described in the first to third embodiments, the rotation angle detection apparatuses 90 to 92 of the present disclosure can have various configurations depending on the application, and can accurately detect the rotation angle of the rotary shaft 32 during the process.

In addition, the detection part 80 verifies the rotation angles detected by the voltage detection parts 81 to 84 and the angle detection parts 85 to 88, and monitors in real time whether each of a plurality of rotary shafts 32 properly rotates. Then, when an abnormality is found, necessary investigation, maintenance, or the like may be performed to adjust and maintain the state so that the rotary shaft 32 properly rotates.

Furthermore, in the present embodiment, there has been described an example in which the rotation angle detection apparatuses 90 to 92 are installed on the rotary shaft 32, but the rotation angle of the rotary shaft 21 may be detected by installing them on the rotary shaft 21. Moreover, the rotation angle detection apparatuses 90 to 92 may be widely applied to apparatuses which perform substrate processing using the rotary table 2 of not only the film forming apparatus but also an etching apparatus.

In addition, there has been described a method of detecting the rotation angle of the rotary shaft 32 of the mounting table 3, but the detection of the rotation angle is actually performed, for example, when performing the process of substrate processing. Hereinafter, an example using the rotation angle detection apparatus 90 according to the first embodiment will be described.

First, as described above, the mounting table 3 is rotated while being revolved by the rotation of the rotary table 2 by rotating each of the rotary mechanism 22 for revolution and the rotary mechanism 53 for rotation (driving gear).

Then, AC power is supplied from the AC power source 70 to the stationary pattern 62. Accordingly, a magnetic field is generated from the stationary pattern 62 to allow a current to flow through the conductive pattern 61b of the movable pattern 61 by an electromagnetic induction action so as to generate an electromagnetic induction voltage.

The voltage detection part 81 detects the electromagnetic induction voltage, and the angle detection part 82 detects the rotation angle of the rotary shaft 32 from the magnitude and change of the electromagnetic induction voltage. This detection is performed in real time, and the rotation angle of each of the plurality of rotary shafts 32 is monitored. When all the rotary shafts 32 properly rotate, the process of substrate processing is continued, and when there is an abnormality, the monitoring is continued, and the apparatus is stopped to take measures such as investigation of the cause or the like. By performing such control, it is possible to always perform the substrate processing in a proper state and to improve the quality of substrate processing.

Figure 12:
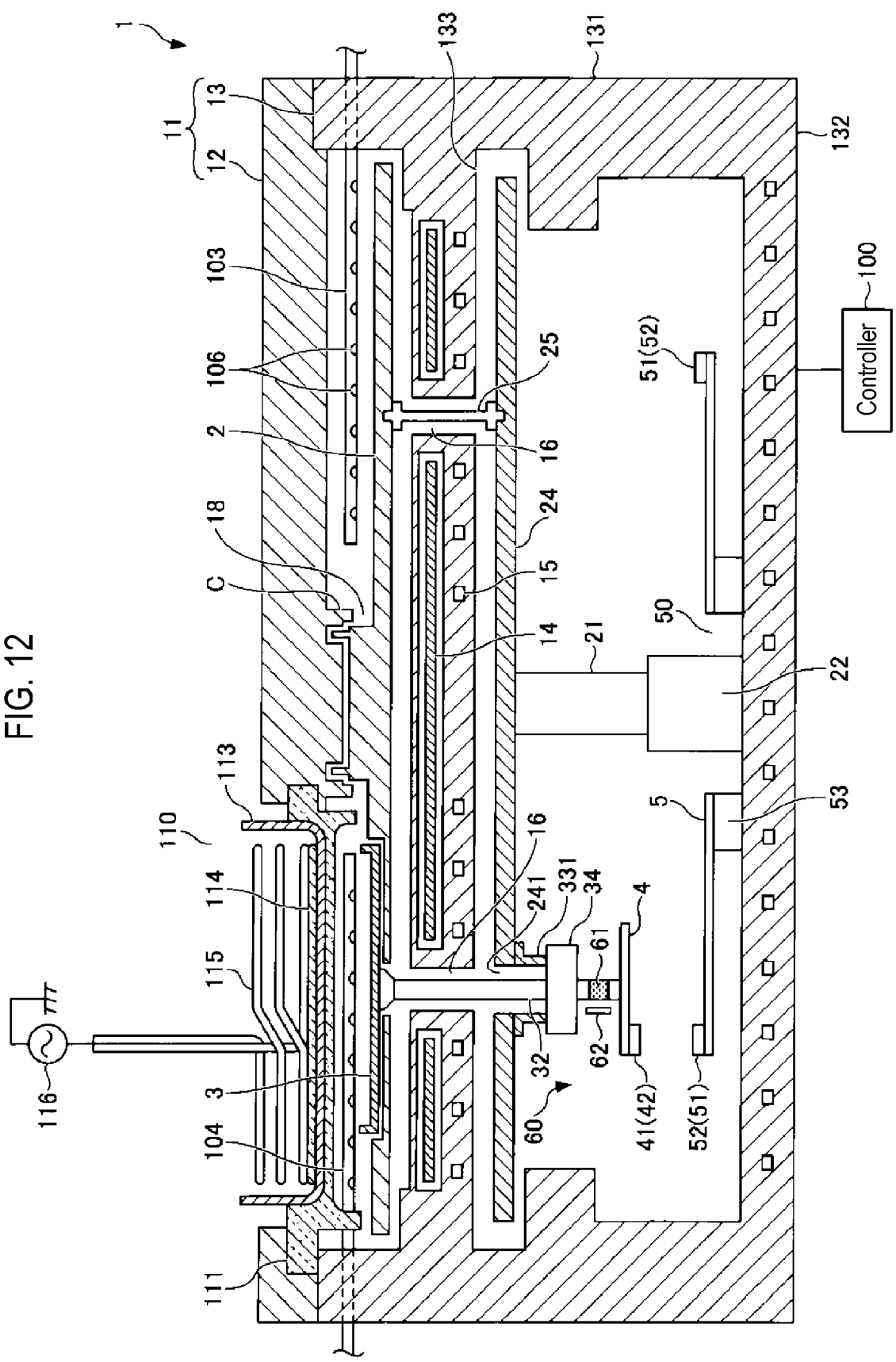
FIG. 12 is a longitudinal sectional view illustrating an embodiment of the present disclosure of a film forming apparatus to which a substrate processing apparatus is applied.

Subsequently, as an embodiment of the substrate processing apparatus according to the present disclosure, a configuration in which a film forming apparatus 1 for performing ALD, which is a film-forming process, on a wafer W, has a mechanism for detecting the rotation amount of the mounting table 3 will be described with reference to FIGS. 12 to 14. As illustrated in FIG. 12, the film forming apparatus 1 includes a vacuum container 11 forming a process container in which a film-forming process is performed. The vacuum container 11 is configured by a container body 13 forming a sidewall 131 and a bottom portion 132 of the vacuum container 11, and a ceiling plate 12 for airtightly closing an opening on an upper surface side of the container body 13. A rotary table 2 formed of a disc is prepared in the vacuum container 11. The rotary table 2 of this example is supported by a disc-shaped support plate 24 from the lower side, in which the support plate 24 is configured to support the mounting table 3 in a state independent of the rotary table 2.

A partition wall 133 is formed in the vacuum container 11 so as to face the bottom portion 132, and the rotary table 2 is installed above the partition wall 133, and the support plate 24 is installed below the partition wall 133. A heater 14 and a refrigerant passage 15 are installed in the partition wall 133 and an annular slit 16 is formed therein. A plurality of pillars 25 are installed on a lower surface of the rotary table 2 in the circumferential direction so as to extend vertically downward to protrude from a position corresponding to the slit 16. Each pillar 25 penetrates the slit 16 and is connected to the support plate 24. The central portion on the lower surface side of the support plate 24 is connected to the rotary mechanism 22 for revolution via the rotary shaft 21. Therefore, when the rotary shaft 21 is rotated, the rotary table 2 is rotated about the vertical axis via the support plate 24 and the pillar 25. In this manner, the support plate 24 belongs to a rotation portion including the rotary table.

The rotary shaft 32 of the mounting table 3 penetrates the slit 16 of the partition wall 133 and the opening 241 of the support plate 24 and extends and protrudes downward, and is connected to a bearing unit 34 fixed to the lower side of the support plate 24 via a cylindrical body 331. The configuration of the mounting table 3 or the magnetic pole part of the driven gear 4 or the driving gear 5, the installation of the rotary mechanism 22 for revolution inside the opening 50 of the driving gear 5, and the like are similar to the rotation detection jig illustrated in FIG. 1, but a portion that supports the magnetic pole part of the driving gear 5 is configured to secure an installation region for a rotary encoder 6 as described hereinbelow.

A circular central region forming portion C and a fan-shaped protrusion 17 formed to widen from the central region forming portion C toward the outside of the rotary table 2, as viewed from the plane, are formed at the central portion of the lower surface of the ceiling plate 12. The central region forming portion C and the protrusion 17 form a ceiling surface lower than that of the region that is positioned radially outer than the central region forming portion C and the protrusion 17 in the inner space of the vacuum container 11. A gap between the central region forming portion C and the central portion of the rotary table 2 forms a flow path 18 of an $N_2$ gas.

Figure 13:
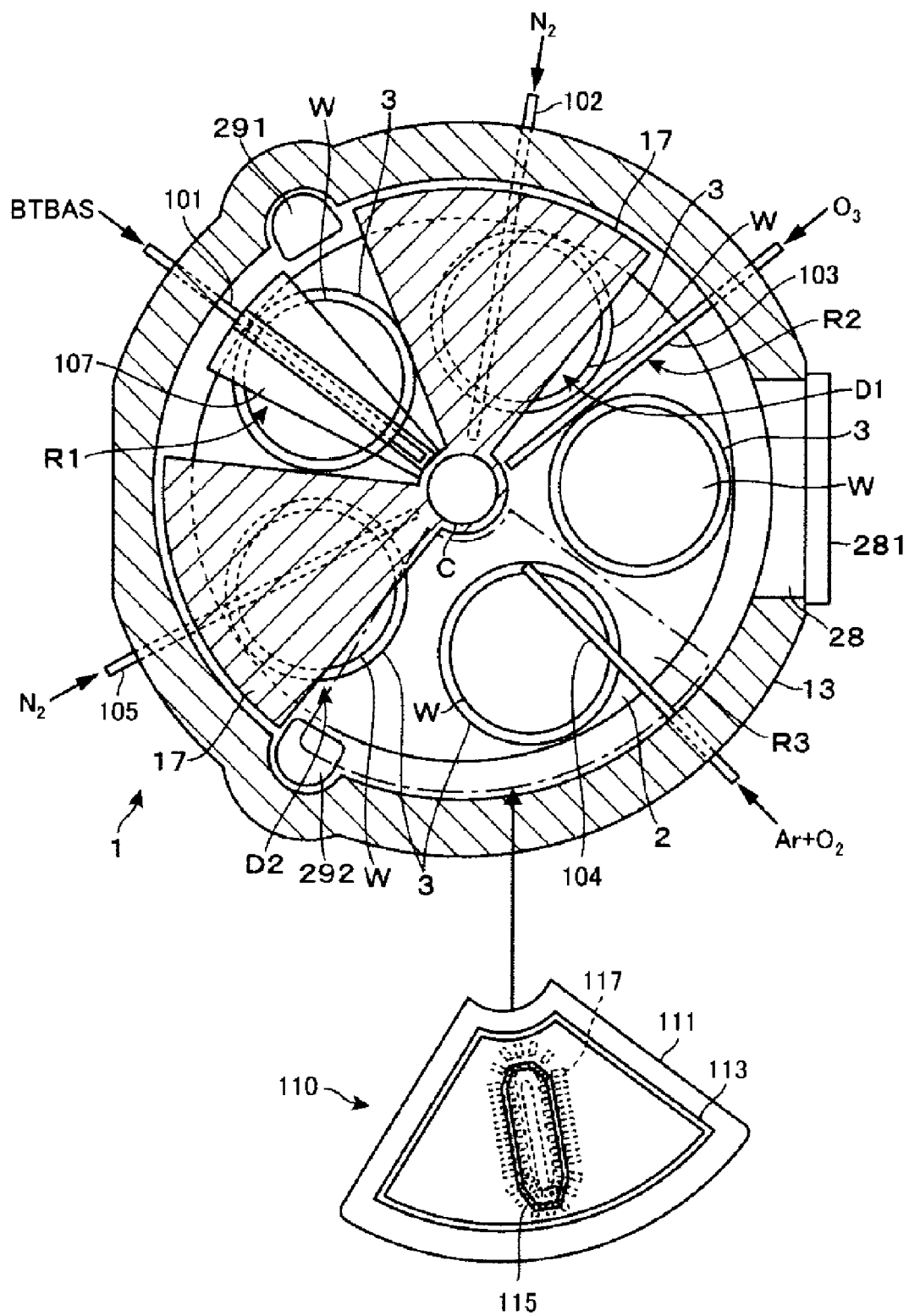
FIG. 13 is a transverse plan view illustrating the film forming apparatus.

As illustrated in FIG. 13, a loading/unloading part 28 configured to be opened and closed by a gate valve 281 is installed on a sidewall surface of the vacuum container 11 (container body 13). The wafers W held by an external transfer mechanism (not shown) are loaded into the vacuum container 11 via the loading/unloading part 28 and transferred to the mounting table 3. The transfer of the wafers W between the mounting table 3 and the transfer mechanism is performed using elevating pins configured to be raised and lowered via through holes (not shown) formed in the respective mounting tables 3, but the illustration of the elevating pins will be omitted.

Furthermore, as illustrated in FIGS. 12 and 13, a raw material gas nozzle 101, a separation gas nozzle 102, an oxidizing gas nozzle 103, a modifying gas nozzle 104, and a separation gas nozzle 105 are sequentially disposed on the upper side of the rotary table 2 in the film forming apparatus 1 at intervals in the rotation direction of the rotary table 2. Each of the gas nozzles 101 to 105 is formed in a rod shape horizontally extending along the radial direction of the rotary table 2 from the sidewall of the vacuum container 11 toward the central portion thereof, and various kinds of gases are discharged downward from a plurality of discharge ports 106 installed spaced apart from each other along its longitudinal direction.

The raw material gas nozzle 101 discharges, e.g., a BTBAS gas. In FIG. 13, reference numeral 107 denotes a nozzle cover that covers the raw material gas nozzle 101, and serves to increase the concentration of the BTBAS gas below it. Furthermore, the oxidizing gas nozzle 103 discharges, e.g., an $O_3$ gas. The separation gas nozzles 102 and 105 discharge, e.g., an $N_2$ gas, and are respectively disposed at positions dividing the protrusion 17 of the ceiling plate 12 in the circumferential direction as viewed from the upper surface. The modifying gas nozzle 104 discharges a modifying gas containing, e.g., a mixture of an argon (Ar) gas and an oxygen ($O_2$) gas. In this example, each of the raw material gas, the oxidizing gas and the modifying gas corresponds to a processing gas.

Furthermore, a plasma forming part 110 is installed above the modifying gas nozzle 104 on the ceiling plate 12. In FIG. 13, the position where the plasma forming part 110 is installed is indicated by an alternate long and short dash line. An antenna 115 around which a metal wire is wound in a coil shape is installed on the upper surface side of the body portion 111 containing a dielectric such as quartz or the like via a Faraday shield 113 and an insulating member 114, and a high frequency power source 116 is connected to the antenna 115. In FIG. 13, reference numeral 117 denotes a slit for directing a magnetic field component of electromagnetic field downward.

The lower region of the raw material gas nozzle 101 on the rotary table 2 corresponds to an adsorption region R1 in which the BTBAS gas is adsorbed, and the lower region of the oxidizing gas nozzle 103 corresponds to an oxidation region R2 in which the BTBAS gas is oxidized. Furthermore, the lower region of the plasma forming part 110 constitutes a modification region R3 in which a $SiO_2$ film is modified by plasma, and the lower region of the protrusion 17 constitutes separation regions D1 and D2 for separating the adsorption region R1 and the oxidation region R2 by the $N_2$ gas discharged from the separation gas nozzles 102 and 105. In the drawing, reference numerals 291 and 292 denote exhaust ports.

Subsequently, the mechanism for detecting the rotation amount of the mounting table 3 will be described. In this example, the movable pattern 61 is prepared at the lower end of the rotary shaft 32 of the mounting table 3, and the stationary pattern 62 is prepared to face the movable pattern 61.

Figure 14:
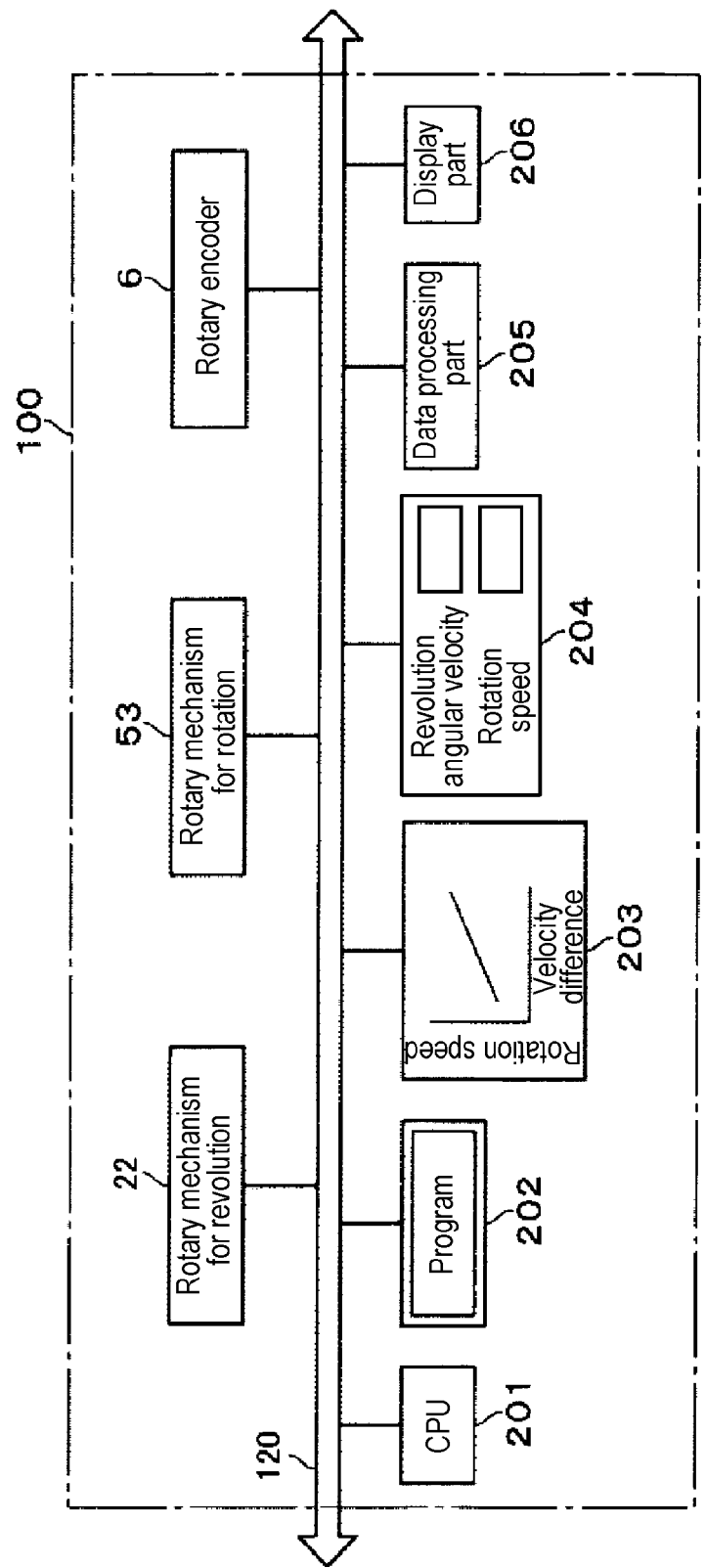
FIG. 14 is a block diagram illustrating an example of a controller installed in the film forming apparatus.

As illustrated in FIG. 14, a controller 100 configured as a computer for controlling operations of the entire apparatus is installed in the film forming apparatus 1. The controller 100 may be configured to include the detection part 80 or may be configured separately.

The controller 100 includes a CPU 201, a program storage part 202 which stores a program for executing operations of the film forming apparatus 1 related to the film-forming process and the rotation amount detection as described hereinbelow, a storage part 203, an input part 204, a data processing part 205, and a display part 206. In the drawing, reference numeral 120 denotes a bus, to which the rotary mechanism 22 for revolution of the rotary table 2 and the rotary mechanism 53 for rotation of the mounting table 3 are connected.

The storage part 203 is configured to store, for example, a relationship between the rotation speed of the driven gear 4, and a velocity difference (Va−Vb) between the angular velocity by revolution of the driven gear 4 and the angular velocity of the driving gear 5. The present inventors have recognized that the velocity difference between the angular velocity by the revolution of the driven gear 4 and the angular velocity of the driving gear 5 and the rotation speed of the driven gear 4 maintain a substantially proportional relationship in a range where the velocity difference exists. For example, when the velocity difference (Va−Vb) between the angular velocity Va of the driving gear 5 and the angular velocity Vb by the revolution of the driven gear 4 is positive ((Va−Vb)>0), the clockwise rotation speed increases as the velocity difference increases. Furthermore, when the velocity difference is negative ((Va−Vb)<0), the counterclockwise rotation speed increases as the velocity difference increases.

The input part 204 is configured as, for example, an operation screen, and is also configured to input the rotation speed of the driven gear 4 and the angular velocity (rpm of the rotary table 2) by the revolution. The data processing part 205 is configured to set a rpm of the driving gear 5 based on input rotation speed of the driven gear 4, input rpm of the rotary table 2, and the relationship stored in the storage part 203. The rotation speed of the driven gear 4 or the angular velocity by the revolution may be input, for example, during maintenance. When the rotation speed and angular velocity of the driven gear 4 are input, the rpm of the driving gear 5 is set by obtaining the velocity difference between the angular velocity by the revolution of the driven gear 4 and the angular velocity of the driving gear 5 from the relationship based on the rotation speed. The display part 206 is configured to display, for example, the detection value of the rotation amount (rotation angle) of the mounting table 3 transmitted from a communication part of a first controller.

Hereinafter, a substrate processing method using the film forming apparatus 1 having the aforementioned configuration will be described. First, when the film-forming process is performed, each mounting table 3 is moved to a position facing the loading/unloading port 28 while intermittently rotating the rotary table 2, and the wafers W are loaded into the vacuum container 11 from the outside and transferred to the mounting table 3 using a transfer mechanism (not shown). Thereafter, a vacuum exhaust is performed via the exhaust ports 291 and 292 such that the interior of the vacuum container 11 has a predetermined pressure. Furthermore, an $N_2$ gas is supplied from the separation gas nozzles 102 and 105 and the central region forming part C to the rotary table 2 and heating of the wafers W by the heater 14 starts, and for example, the wafers W are heated to 400 degrees C.

Then, the rotary table 2 is rotated at a rotation speed of 80 rpm or more, e.g., 120 rpm, by the rotary mechanism 22 for revolution, and the driving gear 5 is rotated by the rotary mechanism 53 for rotation. Accordingly, the mounting table 3 revolves and rotates. On the other hand, supply of each processing gas from the raw material gas nozzle 101, the oxidizing gas nozzle 103 and the modifying gas nozzle 104, and formation of plasma by application of high frequency to the antenna 115 from the high frequency power source 116 start in the vacuum container 11.

At this time, AC power is supplied from the AC power source 70 to the stationary pattern 62. Then, the movable pattern 61 passes through the magnetic field generated by the conductive pattern 62b of the stationary pattern 62, and an electromagnetic induction voltage is generated in the conductive pattern 61b of the movable pattern 61. The voltage detection part 81 of the detection part 80 detects the generated electromagnetic induction voltage, and the angle detection part 85 detects the rotation angle of each of the plurality of rotary shafts 32 from the detected electromagnetic induction voltage. Therefore, five rotation angle detection apparatuses 90 are installed to correspond to the five mounting tables 3. However, the detection part 80 may be integrated into one. Such detection of the rotation angle of the rotary shaft 32 is performed in real time, and it is monitored whether each rotary shaft 32 properly rotates. When an abnormality is detected, measures such as adjusting the conditions of the film forming apparatus 1 or stopping the film forming apparatus 1 to investigate the cause are performed. Thus, it is possible to improve the reliability of the film-forming process.

Each wafer W sequentially passes through the adsorption region R1, the oxidation region R2, and the modification region R3. In the adsorption region R1, the BTBAS gas is adsorbed to the wafer W, and in the oxidation region R2, the adsorbed BTBAS gas is oxidized by an $O_3$ gas to form one or more molecular layers of $SiO_2$. In the modification region R3, the molecular layer of $SiO_2$ is modified by being exposed to the plasma of the modifying gas. Then, the aforementioned cycle is repeatedly performed multiple times by the rotation of the rotary table 2 to laminate the molecular layers of $SiO_2$ so as to form a $SiO_2$ film on the surface of the wafer W.

In this film forming apparatus 1, the rpm of the rotary table 2 and the rotation speed of the mounting table 3 are set such that the rotation of the rotary table 2 and the rotation of the mounting table 3 are not synchronized. That is, the wafer W is set to rotate at such a rotation speed that, when the rotary table 2 makes one rotation from a start point, in which the wafer W is oriented in a first direction, to be positioned at the start point again, the wafer W is oriented in a second direction different from the first direction. As described above, since the mounting table 3 rotates without synchronization with the rotation of the rotary table 2, the wafer W on each mounting table 3 passes through the adsorption region R1 of the raw material gas in various orientations by the rotation and revolution, thereby suppressing deviation of the thickness of the $SiO_2$ film formed on the wafer W, as viewed in the circumferential direction of the wafer W.

When the molecular layers of $SiO_2$ are sequentially laminated by the aforementioned operation and a preset number of cycles is executed, the rotation of the rotary table 2 or the supply of various kinds of gases, the formation of plasma, and the driving of the rotary mechanism for revolution 22 and the rotary mechanism 53 for rotation are stopped, and the film-forming process is completed. Thereafter, the internal pressure of the vacuum container 11 is adjusted, the gate valve 281 is opened to allow the external transfer mechanism to enter, and the wafer W is unloaded in reverse order of the loading.

As described above, according to the rotation angle detection apparatus, the rotation angle detection method, the substrate processing apparatus, and the substrate processing method of the present embodiment, since the substrate processing such as the film-forming process or the like can be performed with the rotary shaft 32 properly rotated, it is possible to improve the quality of the process.

Furthermore, in the aforementioned embodiment, there has been described an example in which the conductive patterns 61b and 62b of the movable pattern 61 and the stationary pattern 62 are used for measuring the electromagnetic induction voltage, but they are also used for measuring a capacitance. In such a case, since the change in overlapping area is important, it is preferable to use a shape in which the overlapping area changes in a solid film pattern rather than a line pattern.

Moreover, in the present disclosure, there has been described an example in which the movable pattern 61 and the stationary pattern 62 are configured as the conductive patterns 61b and 62b, but the rotation angle detection apparatus may be configured by allowing a reflective pattern in which light or the like is reflected, or a pattern in which another type of physical quantity can be measured to face each other. As described above, in the rotation angle detection apparatus, the rotation angle detection method, the substrate processing apparatus, and the substrate processing method according to the present embodiment, patterns containing various materials may be used as long as a changing physical quantity can be detected.

According to the present disclosure in some embodiments, it is possible to detect a rotation angle of a rotary shaft in a non-contact manner even in a vacuum and under a high temperature environment.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A rotation angle detection apparatus comprising:
a movable pattern prepared on an outer peripheral side surface of a rotary shaft and having a shape that changes along a circumferential direction of the outer peripheral side surface; and
a stationary pattern fixedly arranged around the rotary shaft so as to face the movable pattern,
wherein an overlapping state between the movable pattern and the stationary pattern changes by rotation of the rotary shaft, and
wherein a physical quantity changing according to a change in the overlapping state between the movable pattern and the stationary pattern is detected, and a rotation angle of the rotary shaft is detected based on the physical quantity.

2. The apparatus of claim 1, wherein the movable pattern and the stationary pattern are conductive patterns.

3. The apparatus of claim 2, wherein an AC current is supplied to the stationary pattern, and
the physical quantity is an electromagnetic induction voltage generated by movement of the movable pattern in a magnetic field generated by the stationary pattern.

4. The apparatus of claim 2, wherein the movable pattern and the stationary pattern are periodic repeating patterns.

5. The apparatus of claim 4, wherein the periodic repeating patterns include patterns having different pitches.

6. The apparatus of claim 2, wherein a plurality of stationary patterns are fixedly arranged and prepared to be spaced apart in the circumferential direction around the rotary shaft.

7. The apparatus of claim 2, wherein the movable pattern is prepared on a surface of an insulating film, and
the insulating film is adhered onto the outer peripheral side surface of the rotary shaft.

8. The apparatus of claim 7, wherein the insulating film is adhered onto the outer peripheral side surface of the rotary shaft such that that both ends of the insulating film do not overlap with each other,
a second insulating film, which is configured to compliment a region where the insulating film does not exist, is adhered to a position on the outer peripheral side surface of the rotary shaft which does not overlap with the insulating film in an axial direction, and
the stationary pattern is prepared to face a second movable pattern prepared on a surface of the second insulating film to overlap with the second movable pattern.

9. The apparatus of claim 2, wherein the physical quantity is a capacitance.

10. A substrate processing apparatus, comprising:
a process chamber;
a rotary table which is installed in the process chamber and in which a plurality of substrate mounting parts are installed along a circumferential direction on a surface of the rotary table;
a rotary shaft installed on each of the plurality of substrate mounting parts;
a rotary shaft driving mechanism configured to rotate the rotary shaft using a plurality of permanent magnets; and
a rotation angle detection apparatus of claim 1 configured to detect a rotation angle of the rotary shaft.

11. The substrate processing apparatus of claim 10, wherein the rotary shaft and the rotary shaft driving mechanism are connected in a non-contact manner using a magnetic force.

12. The substrate processing apparatus of claim 11, wherein the rotary shaft driving mechanism has an annular planetary magnetic gear magnetically coupled with each of the rotary shafts over an entire circumference of the annular planetary magnetic gear, and all the rotary shafts are rotated by rotation of the planetary magnetic gear.

\* \* \* \* \*